(12) United States Patent
Moore et al.

(10) Patent No.: US 7,381,971 B2
(45) Date of Patent: Jun. 3, 2008

(54) METHOD AND APPARATUS FOR IN-SITU PROBE TIP REPLACEMENT INSIDE A CHARGED PARTICLE BEAM MICROSCOPE

(75) Inventors: Thomas M. Moore, Dallas, TX (US); Lyudmilla Zaykova-Feldman, Dallas, TX (US)

(73) Assignee: Omniprobe, Inc., Dallas, TX (US)

( * ) Notice: Subject to any disclaimer, the term of this patent is extended or adjusted under 35 U.S.C. 154(b) by 221 days.

(21) Appl. No.: 11/186,073

(22) Filed: Jul. 21, 2005

(65) Prior Publication Data
US 2006/0022135 A1 Feb. 2, 2006

Related U.S. Application Data

(60) Provisional application No. 60/592,252, filed on Jul. 28, 2004.

(51) Int. Cl.
*G21K 7/00* (2006.01)
(52) U.S. Cl. ............ 250/442.11; 250/306; 250/307; 250/309; 250/440.11
(58) Field of Classification Search .......... 250/442.11, 250/305–311, 559.27, 440.22, 440.11
See application file for complete search history.

(56) References Cited

U.S. PATENT DOCUMENTS 6,576,910 B2  6/2003  Hashikawa et al.

(Continued)

FOREIGN PATENT DOCUMENTS

JP    2005-345220    12/2005

OTHER PUBLICATIONS

International Preliminary Examining Authority, International Application No. PCT/US05/25745, International Preliminary Report on Patentability, Mar. 5, 2007.

(Continued)

*Primary Examiner*—Jack I. Berman
*Assistant Examiner*—Michael J Logie
(74) *Attorney, Agent, or Firm*—John A. Thomas

(57) ABSTRACT

We disclose a gripper and associated apparatus and methods for delivering nano-manipulator probe tips inside a vacuum chamber. The gripper includes a tube; a compression cylinder inside of and coaxial with the tube; and at least one elastic ring adjacent to the compression cylinder. There is a vacuum seal coaxial with the compression cylinder for receiving and sealing against a probe tip. An actuator is connected to the compression cylinder for compressing the elastic ring and causing it to grip the probe tip. Thus the probe tip can be gripped, transferred to a different location in the vacuum chamber, and released there.

Samples attached to the probe tips will be transferred to a TEM sample holder, shown in several embodiments, that includes a bar having opposed ends; an arm attached to each opposed end of the bar; one or more slots for receiving a probe tip; and, each slot having an inner part and an outer part, where the inner part is smaller than the outer part. The TEM sample holders just described are inserted into a carrier cassette. A cassette for transferring one or more TEM sample holders comprises a platform; at least one bar extending upwardly from the platform; the bar having a groove for receiving and holding a TEM sample holder. A rotatable magazine holds one or more probe tips and selectively releases the tips. The magazine includes a cartridge having a plurality of longitudinal openings for receiving probe tips and dispensing probe tips.

40 Claims, 11 Drawing Sheets

U.S. PATENT DOCUMENTS

| | | | |
|---|---|---|---|
| 6,717,156 | B2 | 4/2004 | Sugaya et al. |
| 6,744,268 | B2 | 6/2004 | Hollman |
| 6,927,391 | B2 * | 8/2005 | Tokuda et al. .............. 250/310 |
| 2003/0236586 | A1 | 12/2003 | Tomimatsu et al. |
| 2004/0144924 | A1 * | 7/2004 | Asselbergs et al. ......... 250/311 |
| 2004/0251412 | A1 * | 12/2004 | Tappel ....................... 250/304 |
| 2004/0251413 | A1 | 12/2004 | Suzuki et al. |
| 2005/0035302 | A1 | 2/2005 | Morrison |
| 2005/0054115 | A1 | 3/2005 | Von Harrach et al. |
| 2005/0184236 | A1 * | 8/2005 | Baur et al. .................. 250/311 |

OTHER PUBLICATIONS

International Searching Authority, International Application No. PCT/US05/25745, International Search Report and the Written Opinion, Oct. 10, 2006.

* cited by examiner

METHOD AND APPARATUS FOR IN-SITU PROBE TIP REPLACEMENT INSIDE A CHARGED PARTICLE BEAM MICROSCOPE

CLAIM FOR PRIORITY

This application claims the priority of U.S. provisional application Ser. No. 60/592,252, filed Jul. 28, 2004 and having the title of "Method and apparatus for in-situ probe tip replacement inside a charged particle beam microscope."

CROSS-REFERENCE TO RELATED APPLICATION

The present application is related to U.S. patent application Ser. No. 10/896,596, filed Jul. 22, 2004, and having the title of: "Method and apparatus for rapid sample preparation in a focused ion beam microscope," which application is incorporated by reference into the present application.

TECHNICAL FIELD

This disclosure relates to the removal of specimens inside focused ion-beam (FIB) microscopes and the preparation of specimens for later analysis in the transmission electron microscope (TEM), and apparatus to facilitate these activities.

BACKGROUND

The use of focused ion-beam (FIB) microscopes has become common for the preparation of specimens for later analysis in the transmission electron microscope (TEM). The structural artifacts, and even some structural layers, in the device region and interconnect stack of current integrated-circuit devices can be too small to be reliably detected with the secondary electron imaging in a Scanning Electron Microscope (SEM), or FIB, which offers a bulk surface imaging resolution of approximately 3 nm. In comparison, TEM inspection offers much finer image resolution (<0.1 nm), but requires electron-transparent (<100 nm thick) sections of the sample mounted on 3 mm diameter grid disks.

The in-situ lift-out technique is a series of FIB milling and sample-translation steps used to produce a site-specific specimen for later observation in a TEM or other analytical instrument. Details on methods of in-situ lift-out may be found in the specifications of U.S. Pat. Nos. 6,420,722 and 6,570,170. These patent specifications are incorporated into this application by reference, but are not admitted to be prior art with respect to the present application by their mention in the background.

The process of in-situ lift-out can be simplified into three successive steps. The first is the excision of the lift-out sample using focused ion-beam milling and extraction of the lift-out sample from its trench. The second is the holder-attach step, during which the lift-out sample is translated on the probe tip point to the TEM sample holder. Then it is attached to the TEM holder (typically with ion beam-induced metal deposition) and later detached from the probe tip point. The third and final step is the thinning of the lift-out sample into an electron-transparent thin section using focused ion beam milling.

However, for in-situ lift-out to be practical for large-wafer FIB chambers or for high-volume TEM sample preparation, the nano-manipulator probe tips must be replaceable without the need to vent the vacuum chamber. Venting of the FIB vacuum chamber is time consuming. It disables the FIB during the venting and re-pumping cycle, and can eventually degrade the performance of the FIB if repeated often. Removing and replacing the entire nano-manipulator probe shaft or nano-manipulator mechanism by way of a vacuum airlock on the FIB chamber is not preferred, because the use of the airlock mechanism adds the extra risk of accidental chamber venting, and because this would require direct access by the user to the periphery of the FIB vacuum chamber. This practice is strongly discouraged by manufacturers of large-wafer in-line FIB's.

There is a need for a method and apparatus for handling one or more sample-tip assemblies without the need for venting the vacuum chamber to exchange probe tips. The proposed methods and apparatus disclosed here offer the benefits of dramatically reduced cycle time for in-situ lift-out and improved usage of in-line (within the process control flow) and off-line (external to the process control flow) analytical tools.

SUMMARY

We disclose a gripper for delivering nano-manipulator probe tips inside a vacuum chamber. The gripper includes an outer tube; a compression cylinder inside of and coaxial with the outer tube; and at least one elastic ring adjacent to the compression cylinder. Preferably, there are two such elastic rings. There is a vacuum seal coaxial with the compression cylinder for receiving and sealing against a probe tip. An actuator is connected to the compression cylinder for compressing the elastic ring and causing it to grip the probe tip. Thus the probe tip can be gripped, transferred to a different location in the vacuum chamber, and released there.

Typically, the probe tips manipulated by the gripper will have samples attached to them, and these samples will be transferred to a TEM sample holder. We disclose a TEM sample holder for holding a probe tip with an attached sample. The TEM sample holder includes a bar having opposed ends; an arm attached to each opposed end of the bar; one or more slots for receiving a probe tip; and, each slot having an inner part and an outer part, where the inner part is smaller than the outer part. In different embodiments, the slots may have a flexible tab at the entrance to the outer part, for retaining the probe tip; or, a constriction at the border between the inner part and the outer part of the slot; or, the border between the inner part and the outer part of the slot has a connection strip across it. In a further embodiment the TEM sample holder slot has an area of UV-curable epoxy for retaining a probe tip with an attached sample.

The TEM sample holders just described are inserted into a carrier cassette, for removal from the vacuum chamber. A cassette for transferring one or more TEM sample holders comprises a platform; at least one bar extending upwardly from the platform; the bar having a groove; and the groove receiving and holding a TEM sample holder. The cassette may also have a die; the die being received by the groove, and the die receives and holds a TEM sample holder. In another embodiment, the cassette has a platform; at least one bar extending upwardly from the platform; the bar having a slot for receiving a probe tip; and the slot has an inner part and an outer part, where the inner part is smaller than the outer part.

We further disclose a magazine for holding one or more probe tips The magazine includes a rod supporting the magazine and concentric with it, and a cartridge. The cartridge has a plurality of longitudinal openings for receiving probe tips, and a shaft concentric with the cartridge. The shaft engages the rod. There is a cover for the cartridge connected to a bearing concentric with the rod. A end cover is attached to the magazine. There is a first alignment hole in the magazine and a second alignment hole in the cartridge cover, so that the cartridge is closed for selectively releasing a probe tip when the alignment holes are aligned with one another and with one of the longitudinal openings in the cartridge.

We also disclose methods of using the above-described apparatus to deliver a nano-manipulator probe tip into and out of a FIB.

DRAWINGS

Figure 21:
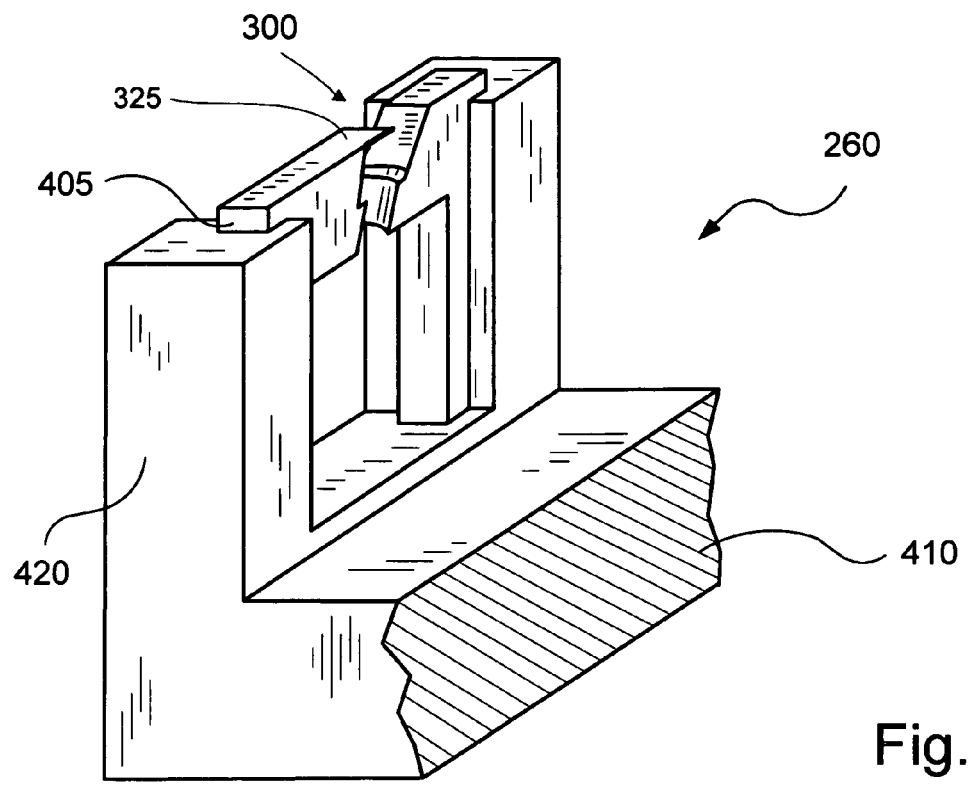
FIG. 21 is a perspective view of a cassette having one bar where the bar is a die with a TEM sample holder. The case of a TEM sample holder with a lock in a slot is shown.
Figure 23:
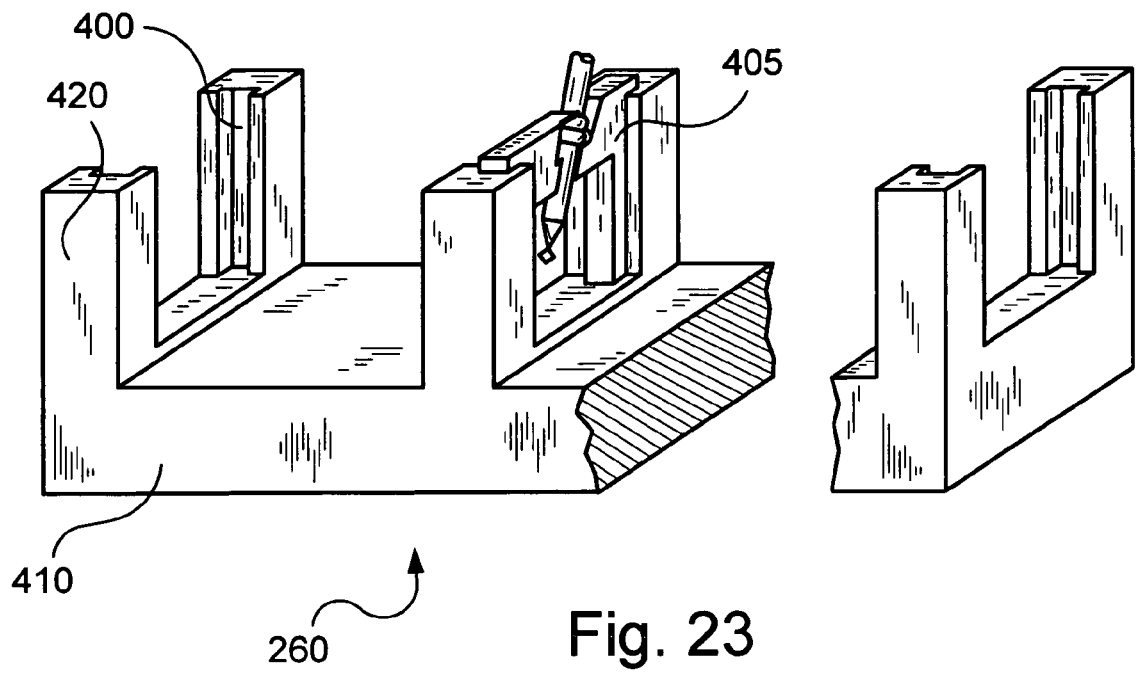

FIG. 23—same as FIG. 21, with several bars.

Figure 22:
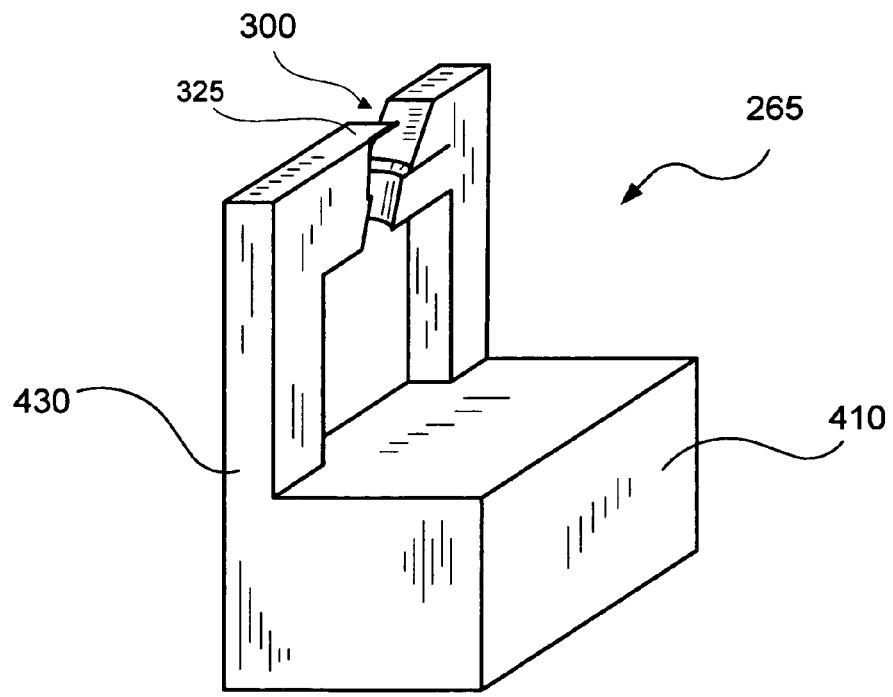
FIG. 22 is a perspective view of a cassette having one bar where the bar is a TEM sample holder. The case of a TEM sample holder with a lock in a slot is shown.
Figure 24:
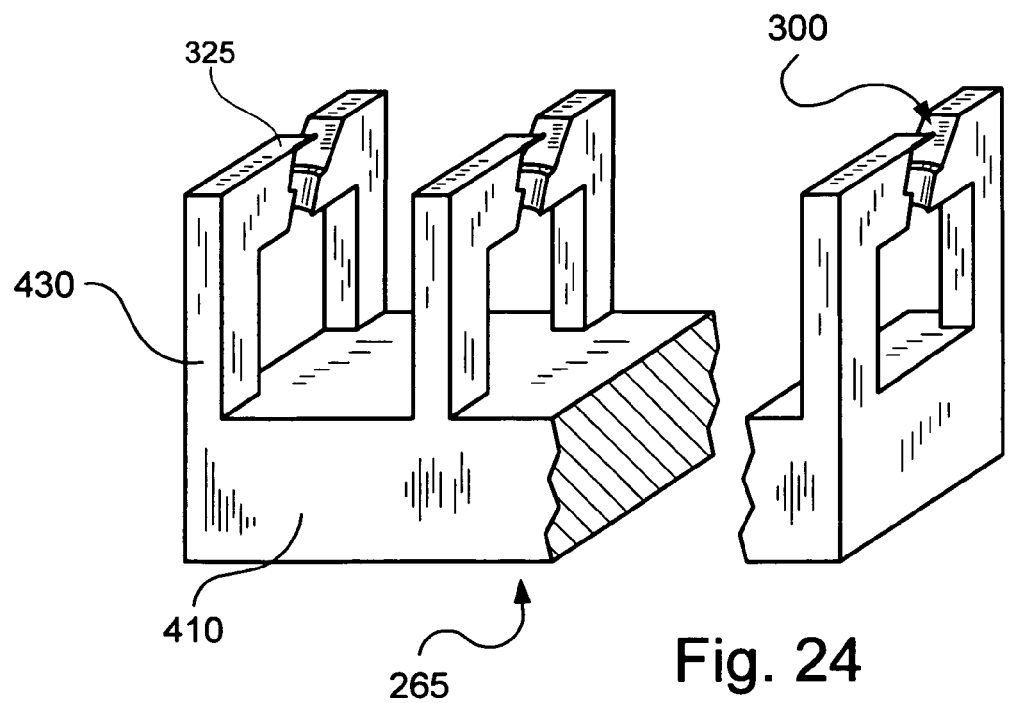

FIG. 24—same as FIG. 22, with several bars.

Figure 25:
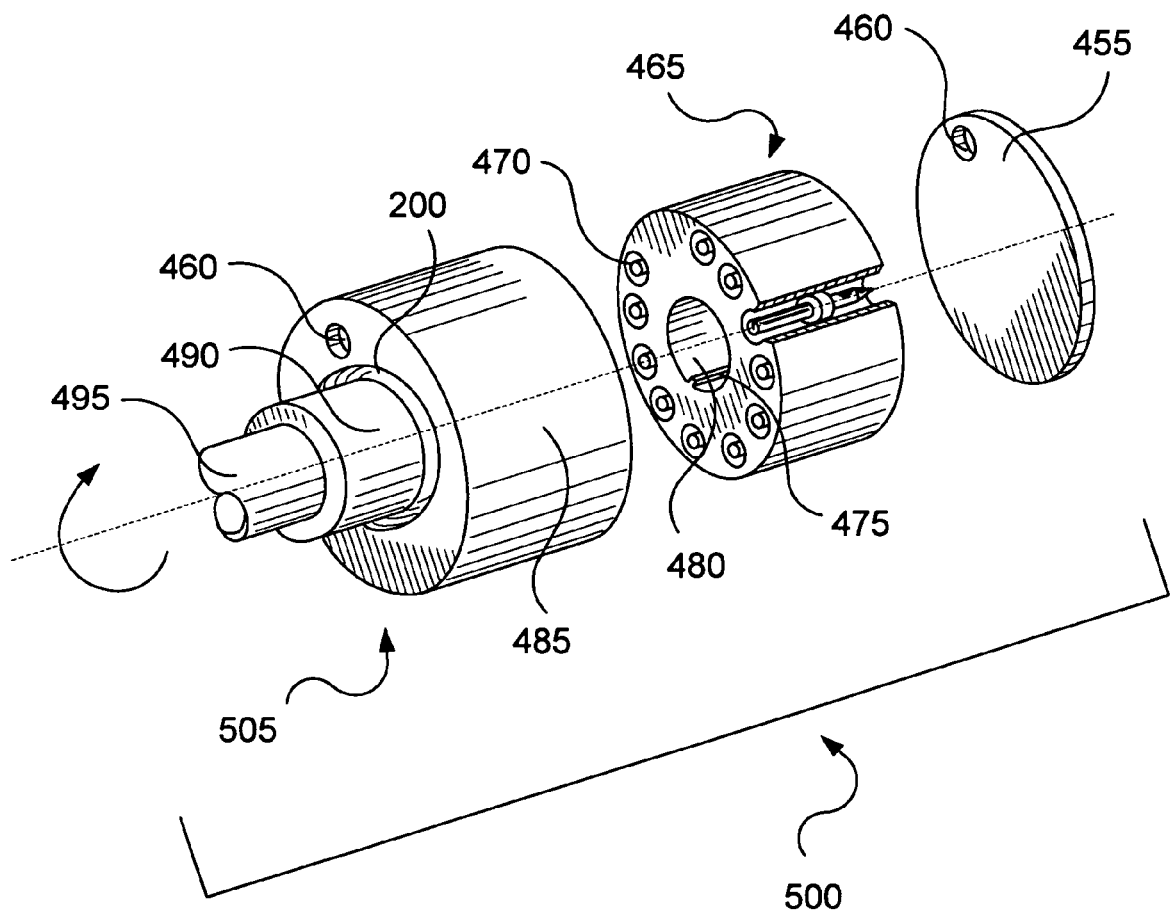

FIG. 25 is a perspective view of a magazine.

DESCRIPTION

We disclose a novel method and apparatus for the nano-manipulator probe tip exchange. In the preferred embodiment, this mechanical process is performed using a nano-manipulator for vacuum applications. The method and apparatus provide for probe tip exchange without venting the vacuum chamber of the FIB. A suitable nano-manipulator system is the Omniprobe AutoProbe, manufactured by Omniprobe, Inc., of Dallas, Tex.

The preferred embodiment includes a nano-manipulator probe shaft with an automated gripper mechanism; a modified probe tip, a probe tip with two metallic collars welded to it; a set of cassettes for bringing the TEM sample holder or holders inside the FIB vacuum chamber and retrieving used probe tips; a set of TEM sample holders; the magazine assembly for the continuous delivery of probe tips into the shaft of nano-manipulator and three methods for exchanging probe tips between the probe shaft and the cassette.

The Gripper Kit

The Gripper

Figure 1:
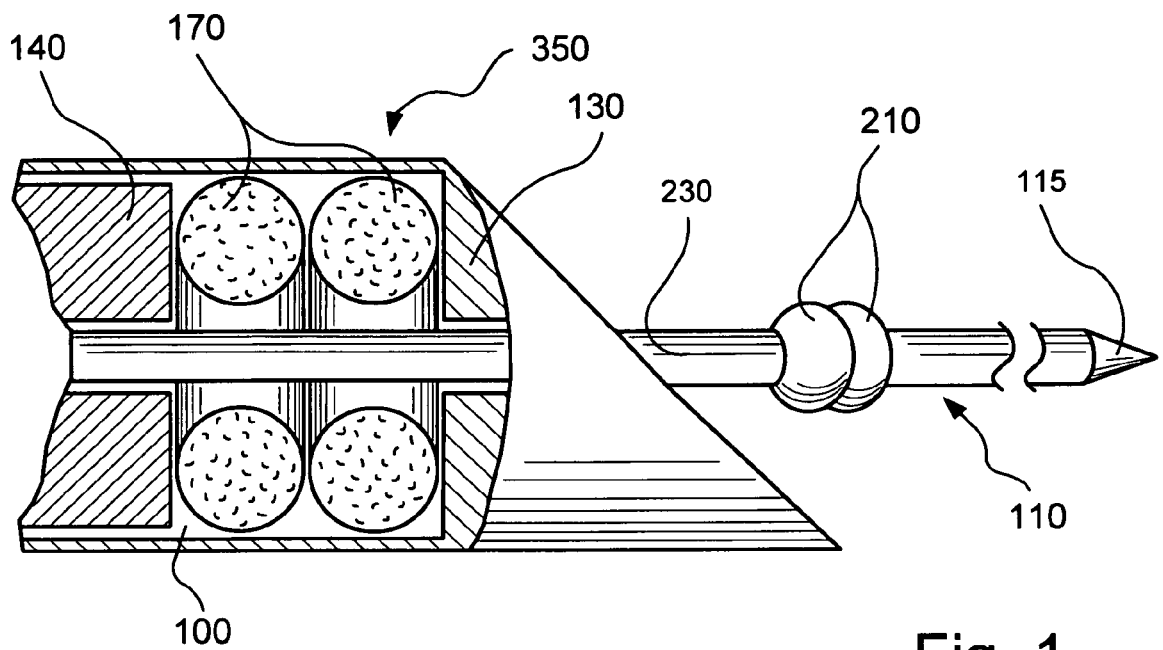
FIG. 1 is a cross-sectional view of the gripping mechanism of the preferred embodiment, where the gripper is released.
Figure 2:
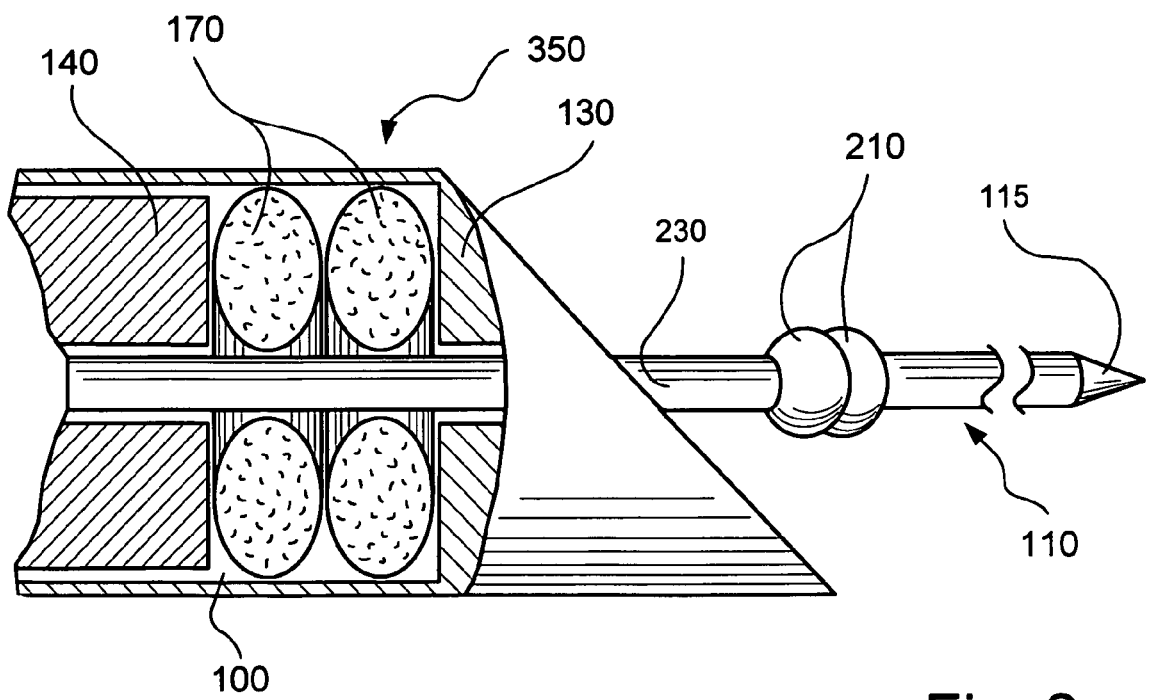
FIG. 2 is a cross-sectional view of the gripping mechanism of the preferred embodiment, where the gripper is compressed.
Figure 3:
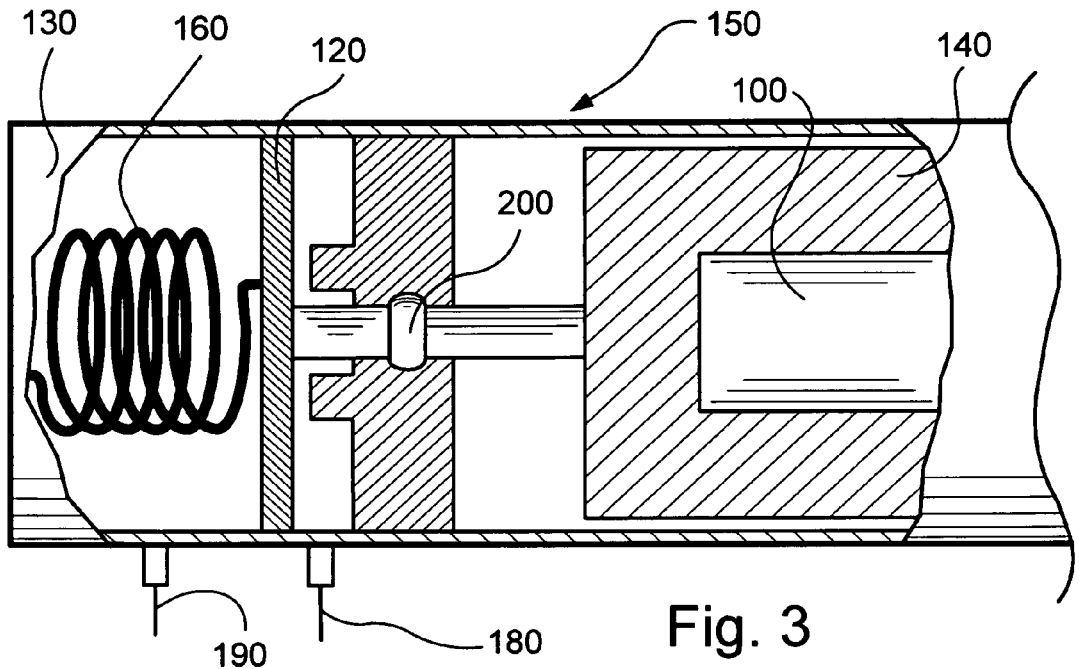
FIG. 3 is a cross-sectional view of the compression mechanism of the preferred embodiment.

In the preferred embodiment, the nano-manipulator probe tip (110) can be delivered into and out of the FIB without venting the vacuum chamber by using the nano-manipulator probe shaft (100) on its way in, and a cassette (260, 265)) and the airlock mechanism (not shown) on its way out. As shown in FIGS. 1, 2 and 3, the gripper comprises of a gripping mechanism (350), located at the internal (to the FIB) termination of the nano-manipulator probe tip shaft (100); a compression mechanism (150), located at the external (to the FIB) termination of the nano-manipulator probe tip shaft; an actuator (120), located outside the FIB and connected to the compression mechanism (150); and the modified probe tip (110).

The probe shaft (100) is the portion of the nano-manipulator that holds the probe tip (110) in its position under the ion and electron beams. In the preferred embodiment, the gripping mechanism (350), shown in FIGS. 1 and 2, is the part of the internal termination of the probe shaft (100) and is located on its end, inside the FIB vacuum chamber. As shown in FIGS. 1, 2, and 3, the gripping mechanism (350) has an outer cylindrical tube (130); an inner compression cylinder (140), which is forced to move by the expansion spring (160); and one or more elastic rings (170), which are compressed and released during the movement of the inner compression cylinder (140). The actuator (120), shown in FIG. 3, is located on the external termination of the probe shaft (100). It is used for retraction and can be pneumatic, electromechanical, piezoelectric or use equivalent means. Pneumatic actuation is shown in FIG. 3. The actuator (120) also comprises the compressed gas in-line (180), exhaust line (190) for pneumatic actuation, if used, and a vacuum O-ring seal (200).

Figure 4:
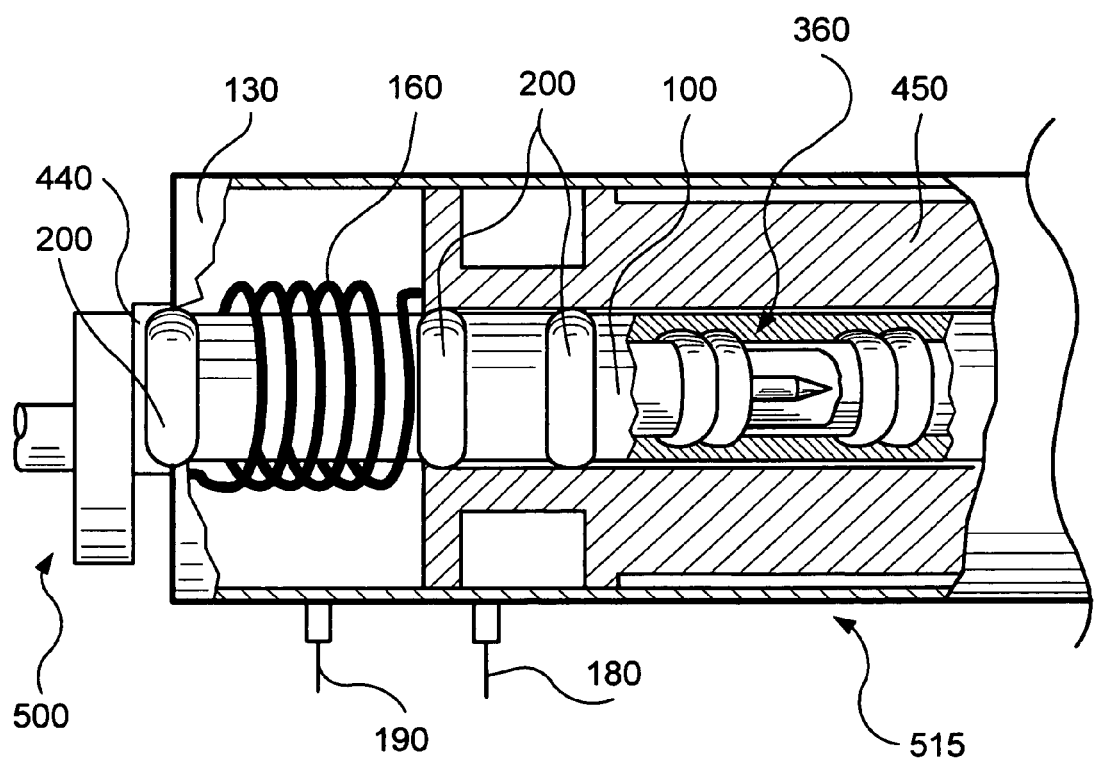
FIG. 4 is a cross-sectional view of the compression mechanism of an alternative embodiment.
Figure 5:
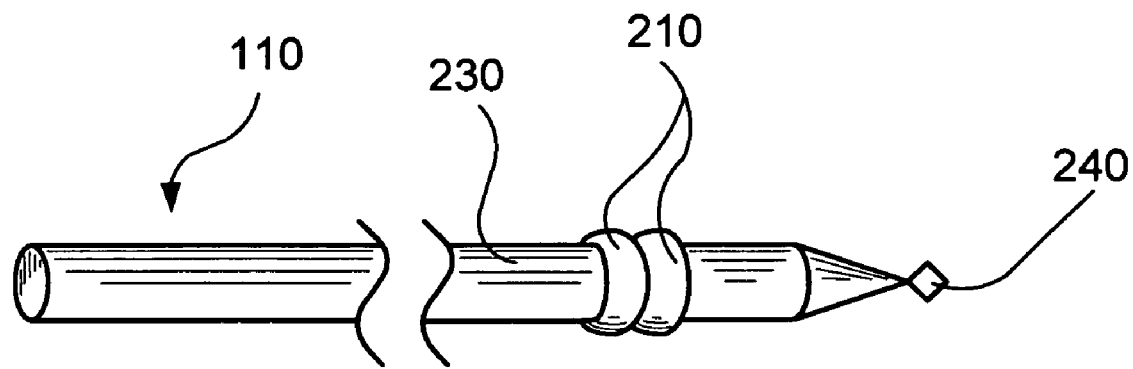
FIG. 5 is a perspective view of the modified probe tip of the preferred embodiment.
Figure 6:
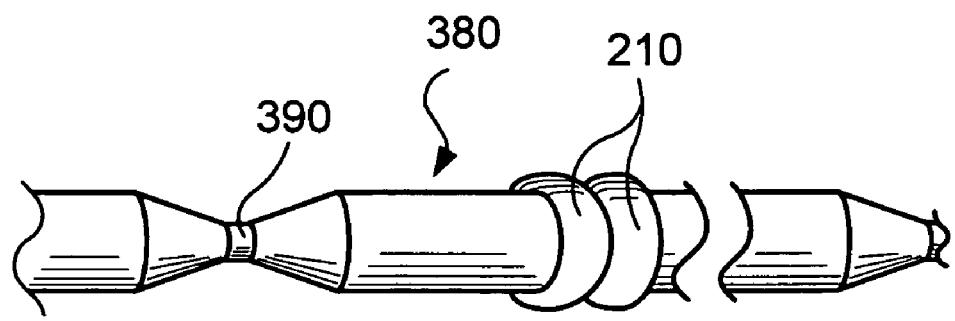
FIG. 6 is a perspective partial view of the continuous probe tip.

A probe tip (110) has at least one, and preferably two, collars (210) The collars (210) are preferably made of nickel-plated copper, attached to the probe tip (110) by crimping, is shown in FIG. 4.

As shown in FIGS. 1 and 2, the outer diameter of a compression cylinder (140) is slightly smaller than the inner diameter of the outer cylinder (130), to allow its free movement during the operation. The inner diameter of an elastic ring (170) is slightly larger than the outer diameter of the probe shank (230) and is approximately the same as the outer diameter of a probe tip collar (210). Its outer diameter in the uncompressed state is approximately the same as the inner diameter of the outer cylindrical tube (130). There can be one or more elastic rings (170); the rings (170) are made of a resilient material that will constrict in its inner diameter sufficiently to grip the probe shank (230), when compressed, in the direction of the cylindrical axis of the probe shaft (100) by the compressive movement of the compression cylinder (140). The elastic ring (170) material must have suitable resilient properties to enable it to respond to a release of the modified probe tip (110), when the compression cylinder (140) is retracted, even after the extended period of its compressed state, in order to be able to complete the exchange of a probe tip (110) at any time. Commercially-available rubber O-rings are generally suitable for this purpose. Since the interface between the elastic rings (170) and the modified probe tip (110) is not a continuous vacuum seal, the vacuum seal (200) is placed between the outer cylindrical tube (130) and the interface with the pneumatic drive shaft.

Figure 7:
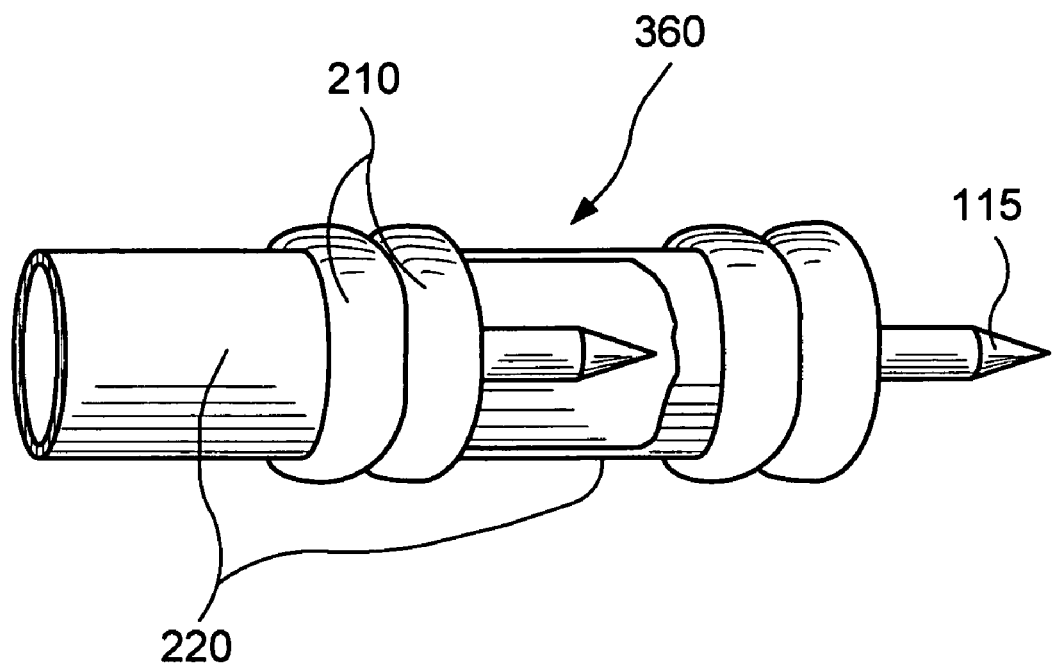
FIG. 7 is a perspective partial view of the succession of probe tips.
Figure 8:
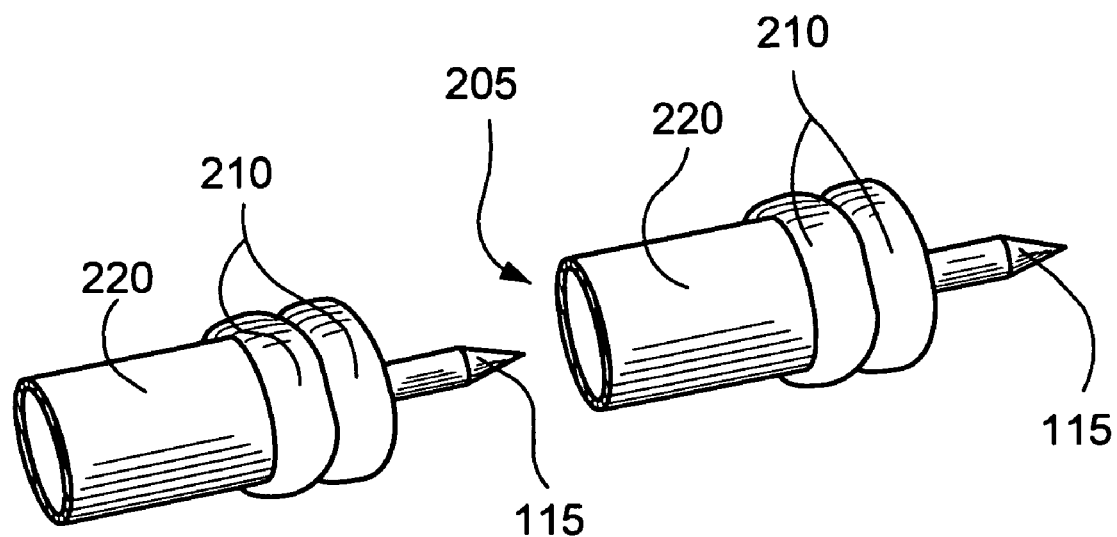
FIG. 8 is an exploded view of a succession of probe tips.

An alternate embodiment (515) is shown in FIGS. 4, 7 and 8, where each individual probe tip (110) has a protective mechanical shield, or capsule (220), attached to it that prevents damage to the fine probe tip point (115) while the probe tip (205) is in the queue inside the hollow probe shaft (100). In FIGS. 4, 7 and 8, the dimension of the capsule (220) relative to the fine probe tip (115) is exaggerated for clarity. Preferably, the inner diameter of the capsule (220) is about 6 times the outer diameter of the fine probe tip (115). Each capsule (220) can protect either the fine tip point (115) in the next probe tip (205) behind it in the queue, or the fine tip point (115) on the probe tip (205) to which the capsule (220) is attached. The capsule (220) and the probe tip (205) can be mechanically combined into one body, or can be temporarily attached and designed to separate as a probe tip (205) is released from the end of the probe shaft (100). In the preferred embodiment, each capsule (220) has two metallic collars (210) for capture, registration and alignment. The capsule is permanently attached to the back end of the probe tip (205) in order to protect the fine tip point (115) on the next probe tip (205) behind it in the queue.

The Set of TEM Sample Holders

The set of TEM sample holders (405) disclosed in this application is shown in FIGS. 9-20. This set comprises two basic types of TEM sample holders (405), one is designed for a top sample surface milling, and another one is designed for the backside milling. The TEM sample holders for backside milling are shown in FIGS. 9, 12, 15 and 18. These TEM sample holders all have the basic design of a long bar (280) with one or more slots (300) and two short bars (290). The TEM sample holders for the top surface sample milling are shown in FIGS. 10, 13, 16 and 19. These TEM sample holders also have the basic design of a long bar (280) and one or more arm-shaped bars (270), each having a slot (300).

The slots (300) in the TEM sample holders are designed to assure the temporary sample-tip assembly (250) attachment to it. Each slot (300) comprises an outer part (310) and an inner part (320), the outer part (310) preferably being the larger.

The slots (300) disclosed in this application are of four different design types.

Figure 9:
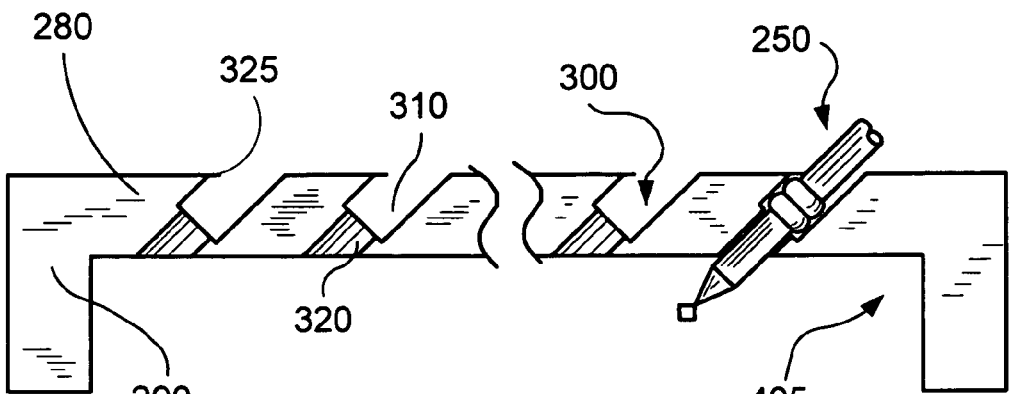
FIG. 9 is a plan view of a TEM sample holder for a sample backside milling.
Figure 10:
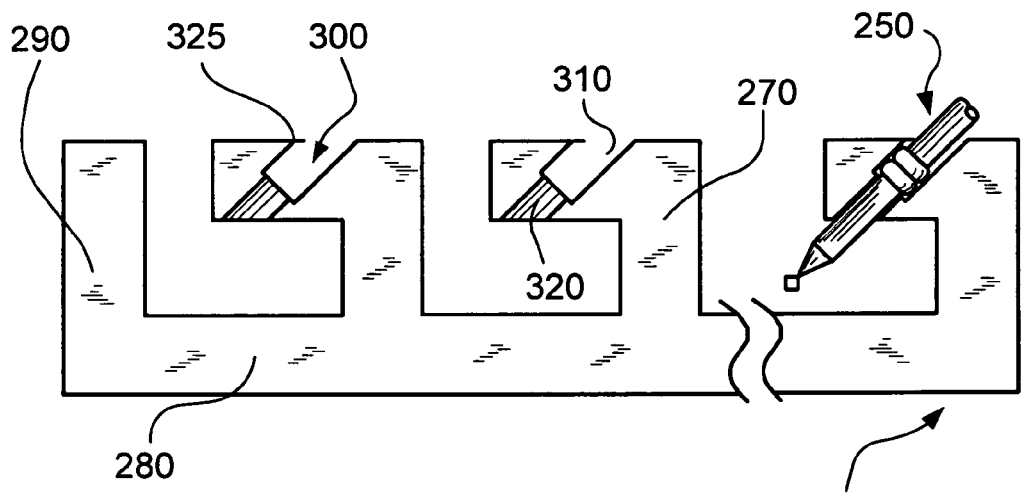
FIG. 10 is a plan view of a TEM sample holder for a sample top milling
Figure 11:
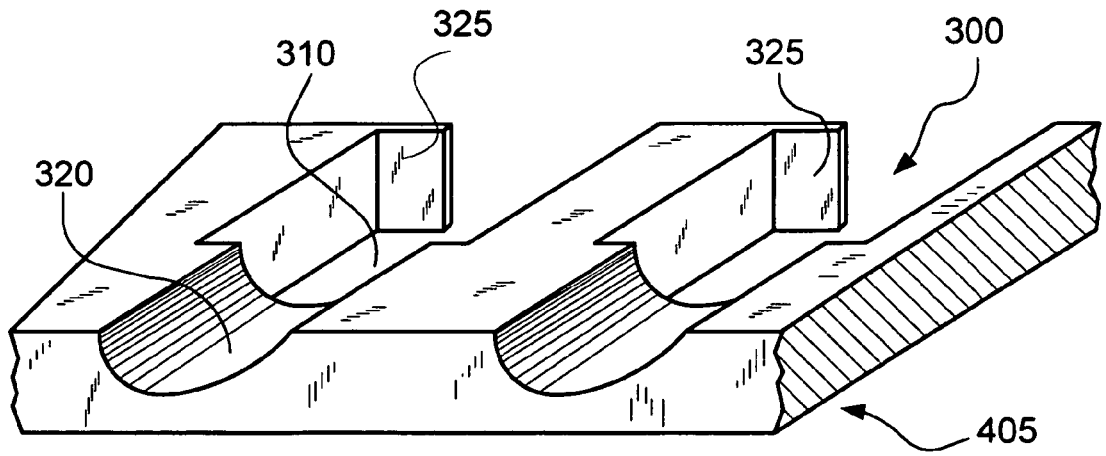
FIG. 11 is the partial perspective view of a sample holder for backside milling.

The first embodiment of a slot (300) is shown in FIGS. 9, 10 and 11. Here the outer part (310) of a slot (300) is hollow and has a size that will allow the collars (210) of a modified probe tip (110) to fit while sliding in, and the movement will be stopped by the border of the smaller inner part (320) of a slot. The border of an outer part (310) of a slot (300) has a spring-like tab (325) on its shorter side, which will temporarily lock the sample-tip assembly (250) inside the TEM sample holder (405). The inner part (320) of a slot (300) can have a tubular or a rectangular cross-section. The approximate position of a sample-tip assembly (250) locked in a TEM sample holder (405) is shown in FIGS. 9 and 10.

Figure 12:
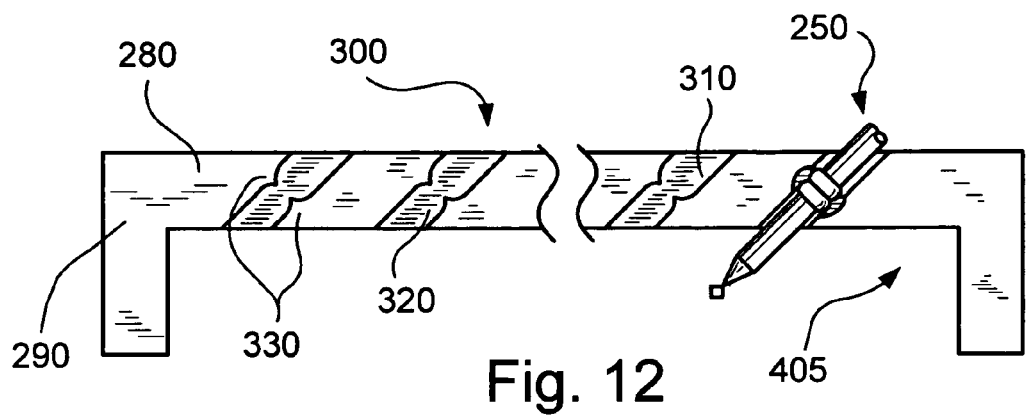
FIG. 12 is the plan view of a TEM sample holder with teeth for a sample backside milling
Figure 13:
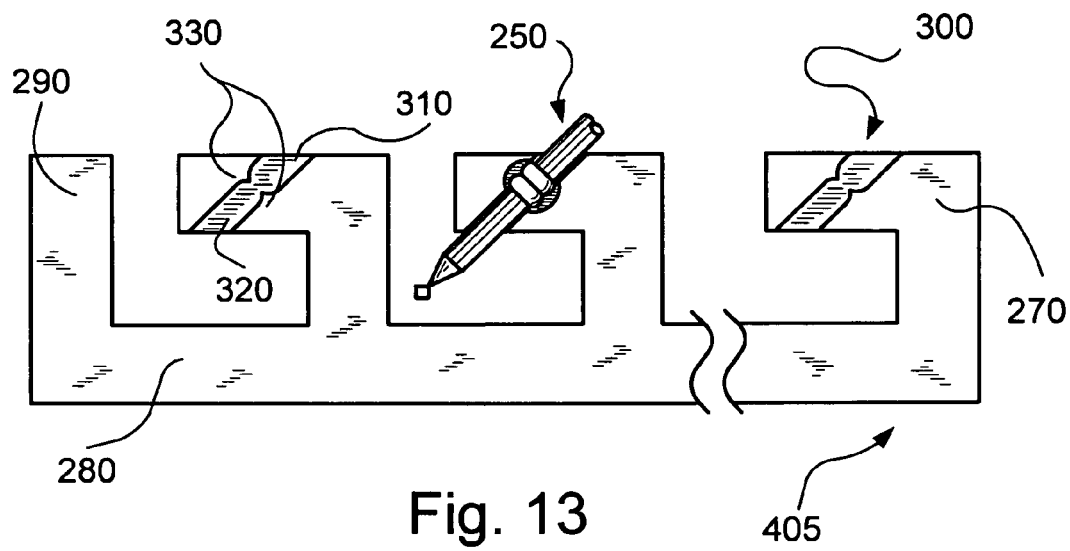
FIG. 13 is the plan view of a TEM sample holder with teeth for a sample top milling
Figure 14:
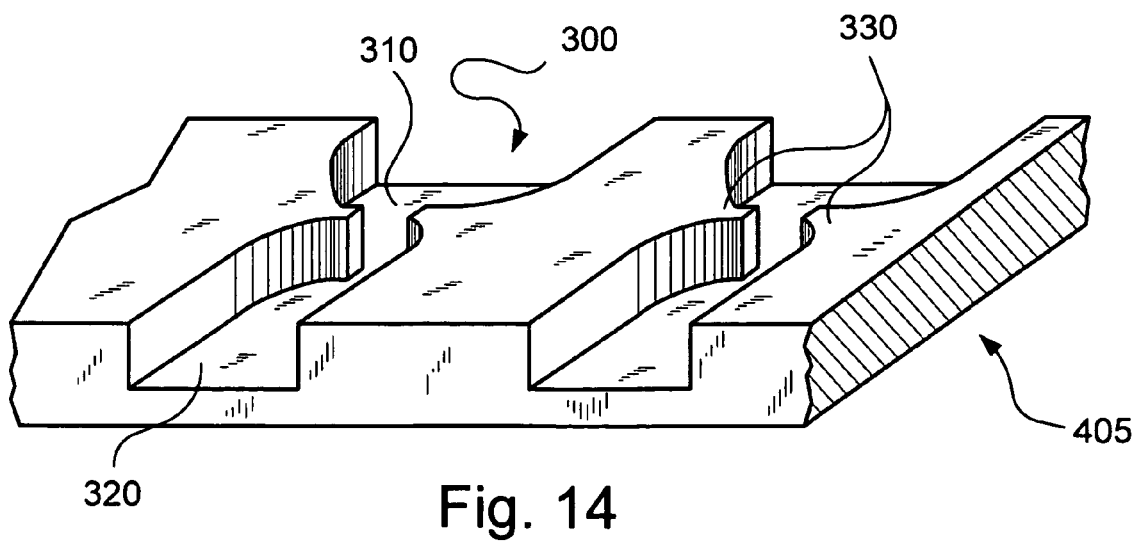
FIG. 14 is the partial perspective view of a sample holder with teeth for a sample backside milling.

The second embodiment a slot (300) is shown in FIGS. 12, 13 and 14. Here the outer part (310) of a slot (300) can be of a circular or a rectangular cross-section, with the outer part (310) preferably being larger. In this design, the slot (300) comprises two prongs (330) located in the border between the outer (310) and the inner part (320) of a slot (300). These prongs (330) will be deformed after the sample-tip assembly (250) is pressed into the TEM sample holder (405) material and this will temporarily attach the sample-tip assembly (250) to a TEM sample holder (405). The approximate position of a sample-tip assembly (250) pressed into a TEM sample holder (405) is shown in FIGS. 12 and 13.

Figure 15:
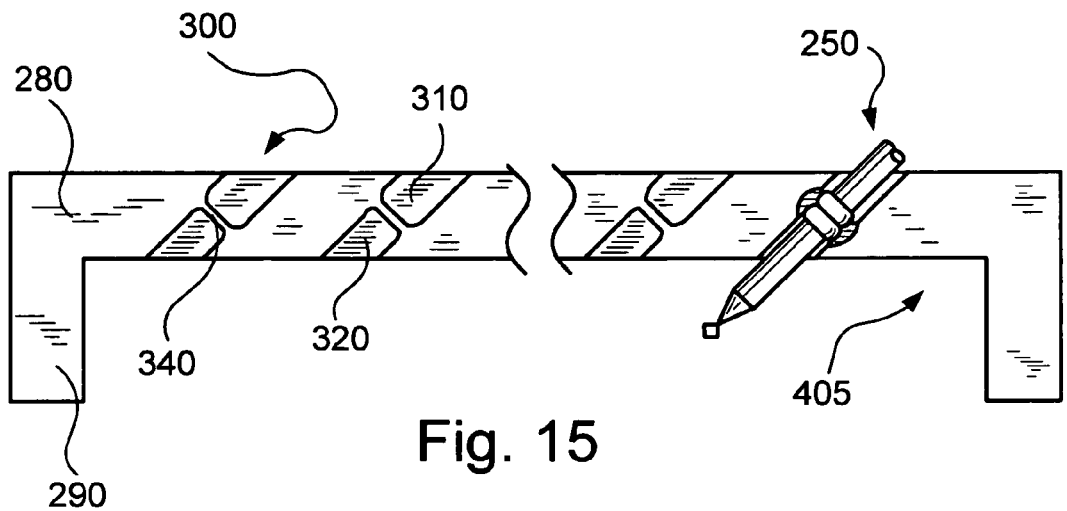
FIG. 15 is the plan view of a TEM sample holder with a connection strip for a sample backside milling.
Figure 16:
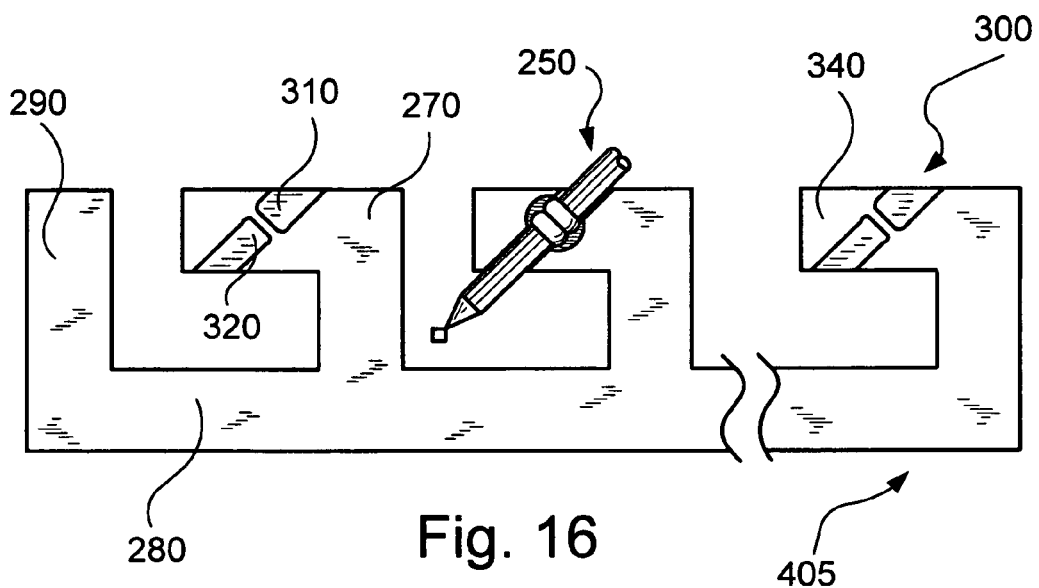
FIG. 16 is the plan view of a TEM sample holder with a connection strip for a sample top milling.
Figure 17:
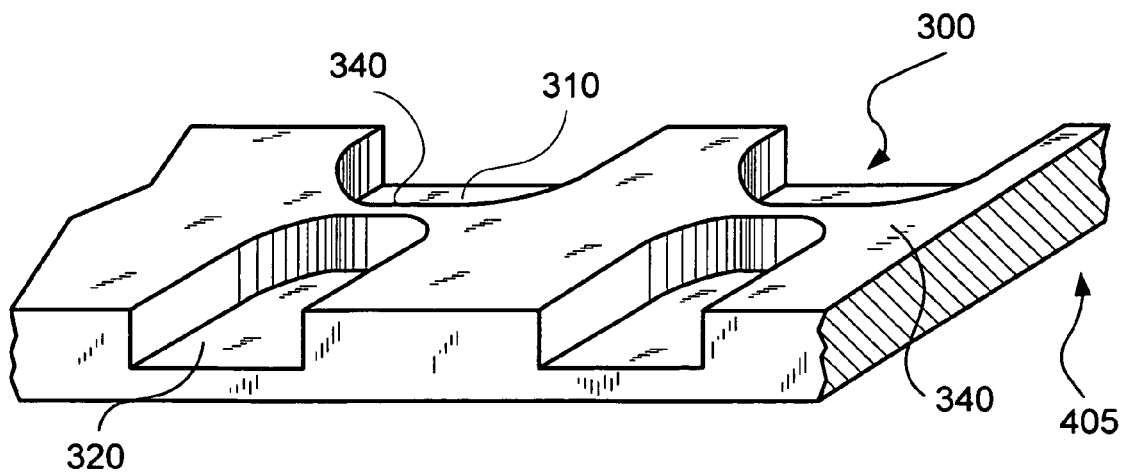
FIG. 17 is the partial perspective view of a sample holder with a connection strip for a sample backside milling.

The third design of a slot (300) is shown in FIGS. 15, 16 and 17. Again, the outer part (310) of a slot (300) can be of a circular or a rectangular cross-section, with the outer part (310) preferably being larger. In this design, the slot (300) comprises a connection strip (340) located in the border between the outer (310) and the inner parts (320) of a slot (300). This connection strip (340) will be deformed after the sample-tip assembly (250) is pressed into the TEM sample holder (405) material and this will temporarily attach the sample-tip assembly (250) to a TEM sample holder (405). The approximate position of a sample-tip assembly (250) locked in a TEM sample holder (405) is shown in FIGS. 15 and 16.

Figure 18:
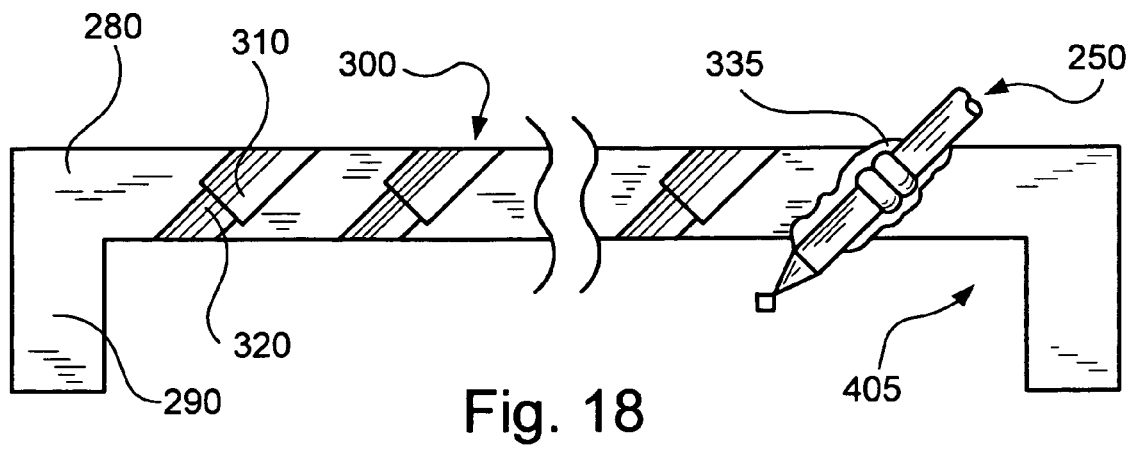
FIG. 18 is the plan view of a TEM sample holder with a slot covered with epoxy for a sample backside milling.
Figure 19:
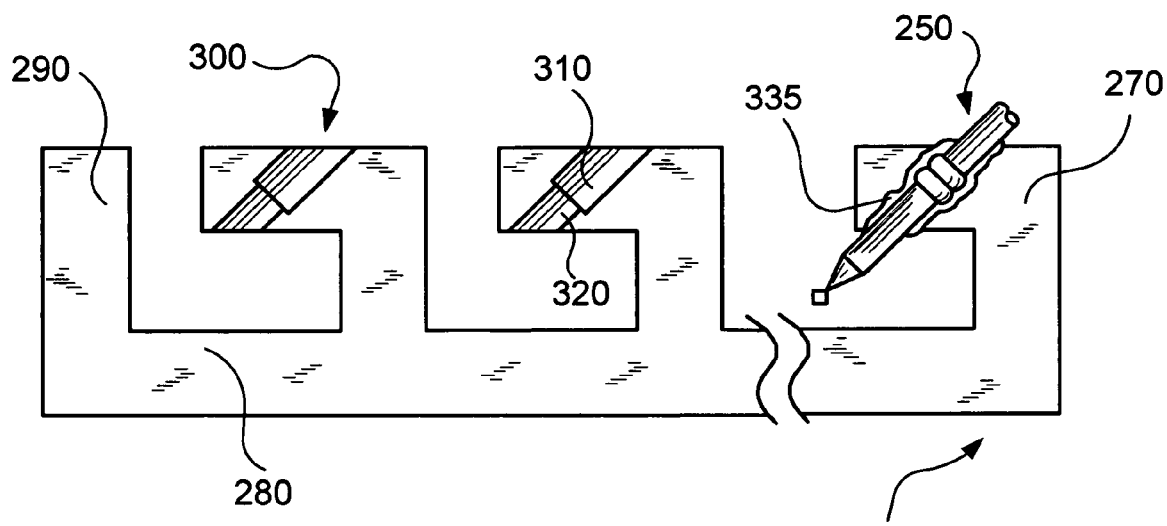
FIG. 19 is the plan view of a TEM sample holder with a slot covered with epoxy for a sample top milling.
Figure 20:
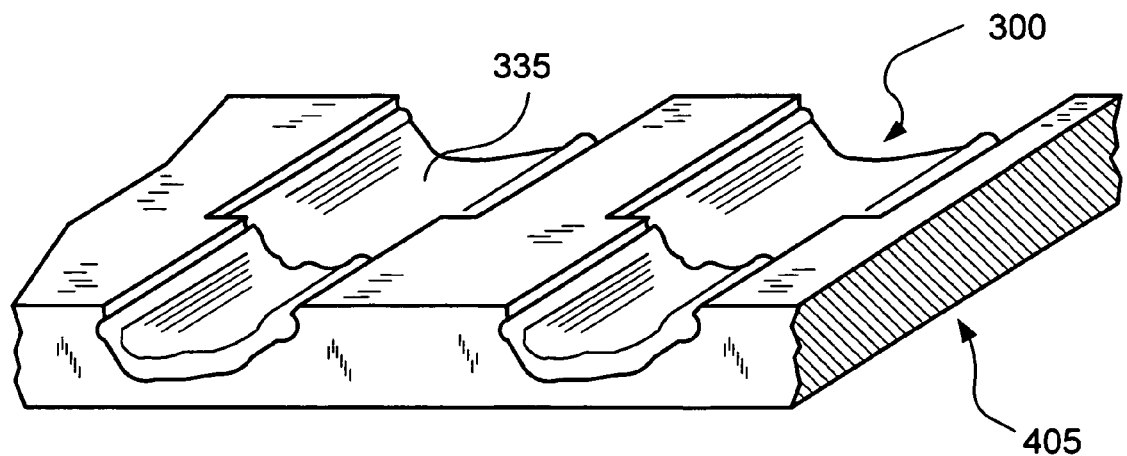
FIG. 20 is the partial perspective view of a sample holder with a slot covered with epoxy for a sample backside milling.

The fourth design of a slot (300) is shown in FIGS. 18, 19 and 20. Here the outer (310) and the inner parts (320) of a slot (300) can be of a tubular or a rectangular cross-section, the outer part (310) preferably being larger. The surface of a slot is covered with a thin layer of epoxy (335), which can be hardened using UV cure, where the UV light rays are preferably delivered through fiber optics (not shown), but can also be delivered by broad illumination of the sample holder (405). The sample-tip assembly (250) is pressed into the slot (300) of a TEM sample holder (405) and so is temporarily attached to the TEM sample holder (405). The approximate position of a sample-tip assembly (250) locked in a TEM sample holder (405) is shown in FIGS. 18 and 19.

The Set of Cassettes

A cassette has a first (260) and second (265) embodiments, as shown in FIGS. 21-24. The cassette is preferably made of aluminum, although other materials with similar mechanical properties could be used.

The cassette (260 or 265) carries different modifications of TEM sample holders (405) from a set inside the FIB vacuum chamber, and carries the used probe tips (110) outside the FIB vacuum chamber through a vacuum airlock, in the same manner as the integrated circuit wafer is carried in and out of the FIB chamber. The cassette (260 or 265) can be attached to a base or a platform that resembles a wafer, or to any other base or a platform, and fits into the wafer-gripping mechanism of the FIB stage. The vertical dimension of the cassette (260 or 265) plus any carrier on which it is attached, must be less than the maximum height that can pass through the wafer exchange airlock on the FIB chamber.

The cassettes (260) and (265), shown in FIGS. 21-24 may have a rectangular or any other convenient shape. The cassette (260) of the first embodiment comprises of two parts, the first being a platform (410), and the second includes one or more bars (420). The bars (420) have grooves (400) where the dies (370) may be inserted. The die (370) of this embodiment allows one to attach the sample-tip assembly (250) to a TEM sample holder permanently, using a press or any other method without the additional alignment.

The second cassette embodiment (265) includes a platform (410) with one or more bars (430), where the bar (430) itself is a die (370) that will be used in a press to attach the sample-tip assembly (250) to the TEM sample holder (405) permanently, or, alternatively, the bar (430) itself can function as a TEM sample holder. The second cassette embodiment (265) also has one or more bars as shown in FIGS. 23 and 24.

The cassette (260, 265) can be placed on any platform or can represent any platform or stage, including the stage or a die of a apparatus for rapid sample preparation, if this apparatus is located inside the FIB vacuum chamber. Such an apparatus is disclosed in the co-pending U.S. patent application titled "Method and apparatus for rapid sample preparation in a focused ion beam microscope," as cited above and incorporated into the present application. The apparatus is referred to in the present application as a "press."

The Magazine Assembly

The magazine assembly (500) of the preferred embodiment is shown in FIG. 25. The cartridge (465), preferably cylindrical, has one or more cylindrical openings (470) arranged at a constant radius from the axis of the cartridge (465), where every but one opening (470) has the modified probe tip (110) inside it. The cartridge has an inner cylindrical shaft (480) with a key (475) on the wall of the shaft.

The inner lid or cover (455) has one alignment hole (460) of the same size as the cylindrical opening (470) located at the same radial distance from the lid center as the distance between the cylindrical axis of cartridge (465) and the cylindrical opening (470). The diameter of the cover (455) is equal to the diameter of a cartridge (465).

The outer cover (505) of a cartridge (465) comprises a cylindrical cover (485) that has at least one alignment hole (460) of the size of the cylindrical opening (470), located at the same radial distance from the center of the cover (455) as the distance between the cartridge's (465) cylindrical axis and the cylindrical opening (470). The outer cover (505) further comprises a rod (495) attached to it and extending inside and outside the outer surface of the cover (505). A groove in the rod (495) (not shown) matches the key (475) on the wall of the inner shaft (480) of a cartridge (465). The bearing (490), preferably a ball bearing, is attached to the outer surface of an outer cover (505). The vacuum seal (440) and the spinning mechanism (not shown) are located outside the magazine assembly (500). The spinning mechanism can be an electric motor or other kind of motor.

The alternate embodiment (515) of the gripper, shown in FIG. 4, is intended for use with the magazine assembly (500), and comprises an inner compression cylinder (450), an expansion spring (160), a probe shaft (100) for the successive set of probe tips (360), a compressed gas in-line (180), an exhaust line (190) (both for pneumatic actuation), three vacuum O-ring seals (200), located inside the outer cylindrical tube (130), and the shutter seal (440) for the vacuum-safe connection with the magazine assembly (500).

Methods for Delivering the Probe Tip In and Out of the FIB

The entire sample preparation process can take place in the in-line FIB, or it can be separated for three steps, where the first step takes place in the in-line FIB, the second step takes place outside the FIB, and the third step takes place in the off-line FIB.

Single Tip Method

The first method is the single tip method. In this scenario, the modified probe tip (110) is being delivered via the nano-manipulator probe shaft (100) inside the FIB vacuum chamber. This method uses a gripper kit. The gripper kit comprises the gripper (350), described above, that is a part of the nano-manipulator probe shaft (100), a modified probe tip (110), the set of TEM sample holders (405), and a set of cassettes (260 or 265), all as described above. The cassettes carry the TEM sample holder (405) and new probe tips (110) into the FIB vacuum chamber and the probe tips with TEM samples attached (the sample-tip assemblies (250)) out of the FIB vacuum chamber, through the existing FIB vacuum chamber airlock mechanism.

The press described in the co-pending application cited above that is used to permanently attach the sample-tip assembly (250) to a TEM sample holder (405) can be located either inside or outside the FIB vacuum chamber. The cassette (260), carrying the TEM sample holder coupon (405), can be brought inside the vacuum chamber ahead of time or anytime during the process using the existing airlock mechanism. The cassette (260) can be placed on a stage of a press or the cassette (265) can be the outer die itself.

The sequence of events can be changed, so the sample or samples (240) can be thinned first to a thickness appropriate for TEM inspection by ion beam milling, and then the sample-tip assemblies (250) could be attached to the TEM sample holder (405).

Continuous Feed Method

The second method, referred to as the continuous feed method, involves a continuous length of probe tip material (380), which is located inside the nano-manipulator probe shaft (100). The probe tip (110) can be mechanically cut or ion milled away from the remaining length of the continuous probe tip material (380) after the lift-out sample (240) is attached to it for transfer to the cassette (260) or (265). The length of continuous probe tip material (380) inside the probe shaft (100) is then extended so that the tip of this material is at the correct position to function as the new probe tip. The length of continuous probe tip material (380) can be shaped in advance with narrow sections (390) at predetermined intervals to facilitate the separation step. Ideally, during the process of separating the existing sample-tip assembly (250) from the length of continuous probe tip material (380) the tip of the length of probe tip material is formed in an appropriate shape for it to function as the new probe tip. The cassette (260) or (265) with one or more sample-tip assemblies (250) can be carried out of the chamber through the airlock mechanism or moved to another location inside the FIB. The process can be repeated until the cassette is full and is ready to be carried out of the vacuum chamber for further sample investigation.

Capsule Method

The third method, referred to as the capsule method, involves a succession of individual probe tips (360) contained inside the cylindrical hollow probe shaft (100), a magazine assembly (500) of new probe tips (110) located at the external end of the probe shaft (100), a gripper (350) at the internal end of the probe shaft (100), and the cassette (260) or (265) inside the FIB vacuum chamber, as described above.

After the sample (240) is attached to the probe tip point (115), the created sample-tip assembly (250) is released from the probe shaft (100) and is transferred to a specific slot (300) in a TEM sample holder (405) located in the cassette (260) or (265). As the sample-tip assembly (250) is released from the probe shaft (100), the capsule (220) for the next probe tip (110) is also released and the next probe tip (110) is advanced into position at the internal end of the probe shaft (100).

The magazine assembly (500) at the external end of the probe shaft (100) provides a supply of new probe tips (110) to be injected into the probe shaft (100). The magazine assembly (500) can be maintained under common vacuum with the probe shaft (100) and FIB chamber. The magazine assembly (500) is preferably circular, with probe tips (110) arranged at a constant radius from the center, or in a linear or rectangular shape with a means for advancing the probe tips (110) to the position for injection into the probe shaft (100) through the opening (460) in the upper cylindrical cover (485). The injection means can be a piston (not shown) actuated by pneumatic, electromagnetic, piezoelectric or other suitable actuation.

The magazine assembly is assembled such that both alignment holes (460) and the one cylindrical opening (470) of a magazine cartridge that is filled in with the cartridge (465) material, are aligned, which alignment assures the closed state of a cartridge (465). After the sample-tip assembly (250) is completed with the sample (240) and is released to a TEM sample holder (405), the magazine spinning means is actuated by any electrical, pneumatic or piezoelectric means, the magazine cartridge (465) rotates using the ball bearing (490), so the alignment holes (460) in covers (455) and (485) and the next cylindrical opening (470) of the cartridge (465) are aligned, and the new probe tip (205) is injected into the probe shaft (100).

As new probe tips with capsules (220) are injected into the probe shaft (100), the queue of probe tips (205) inside the probe shaft (100) is advanced, the previous probe tip (110), now with a TEM sample (240) attached, is selectively ejected from the probe shaft (100) into the cassette (260) or (265), and the next probe tip (205) in the queue inside the probe shaft (100) is presented at the internal end of the probe shaft (100) and captured by the gripping mechanism (350) The gripping mechanism (350) at the internal end of the probe shaft (100) is similar to that described above, but allows for the queue of probe tips (205) to proceed down the center of the hollow probe shaft (100).

The compression cylinder (140) of the gripper (350) is retracted to permit the ejection of the previous probe tip (205) with a TEM sample (240) attached and the positioning of the replacement probe tip (110). The process of injecting probe tips (205) into the probe shaft (100) and transferring tip-sample assemblies (250) into the cassette (260) or (265) can be continued until the cassette (260) or (265) is full, or until the magazine cartridge (465) is empty.

We claim:

1. A nano-manipulator probe tip for use in a gripper; the probe tip comprising: a probe body; and, at least one concentric collar permanently fastened to the probe body.

2. The nano-manipulator probe tip of claim 1, where the probe body further comprises:
   a plurality of sections; the sections having reduced diameter at regular intervals;
   the collar fastened to the probe body between each section; and,
   the sections of reduced diameter having a minimum diameter so that, when cut at the point of minimum diameter, the cut forms a tip point.

3. The nano-manipulator probe tip of claim 1, where the collar comprises a section of metal wire crimped to the probe body.

4. The nano-manipulator probe tip of claim 1 where the number of collars is two.

5. A gripper for delivering nano-manipulator probe tips inside a vacuum chamber, the gripper comprising:
   an outer tube;
   a compression cylinder inside of and coaxial with the outer tube;
   at least one elastic ring adjacent to the compression cylinder;
   a vacuum seal coaxial with the compression cylinder for receiving and sealing against a probe tip; and,
   an actuator connected to the compression cylinder for compressing the elastic ring and causing it to grip the probe tip.

6. The gripper of claim 5, further comprising a spring for biasing the compression cylinder.

7. The gripper of claim 5 where the number of elastic rings is two.

8. A TEM sample holder for holding a probe tip with an attached sample, the TEM sample holder comprising:
   a bar having opposed ends;
   an arm attached to each opposed end of the bar;
   one or more slots for receiving a probe tip; and,
   each slot having an inner part and an outer part, where the inner part is smaller than the outer part.

9. The TEM sample holder of claim 8 where the slots have a flexible tab at the entrance to the outer part, for retaining the probe tip.

10. The TEM sample holder of claim 8 where the border between the inner part and the outer part of the slot has a constriction.

11. The TEM sample holder of claim 8 where the border between the inner part and the outer part of the slot has a connection strip across it.

12. The TEM sample holder of claim 8 where the slot has an area of UV-curable epoxy.

13. A cassette for transferring one or more TEM sample holders, the cassette comprising:
    a platform;
    at least one bar extending upwardly from the platform; the bar having a groove;
    the groove receiving and holding a TEM sample holder.

14. The cassette of claim 13 further comprising:
    a die; the die being received by the groove;
    the die receiving and holding a TEM sample holder.

15. A cassette for transferring one or more TEM sample holders, the cassette comprising:
    a platform;
    at least one bar extending upwardly from the platform; the bar having a slot for receiving a probe tip; and, the slot having an inner part and an outer part, where the inner part is smaller than the outer part.

16. The TEM sample holder of claim 15 where the slots have a flexible tab at the entrance to the outer part, for retaining the probe tip.

17. The TEM sample holder of claim 15 where the border between the inner part and the outer part of the slot has a constriction.

18. The TEM sample holder of claim 15 where the border between the inner part and the outer part of the slot has a connection strip across it.

19. The TEM sample holder of claim 15 where the slot has an area of UV-curable epoxy.

20. A magazine for holding one or more probe tips, the magazine comprising:
    a rod supporting the magazine and concentric with it;
    a cartridge; the cartridge further comprising:
        a plurality of longitudinal openings for receiving probe tips;
        a shaft concentric with the cartridge; the shaft engaging the rod;
        a bearing concentric with the rod;
        a cover for the cartridge connected to the bearing;
        a end cover attached to the magazine;
        a first alignment hole in the magazine;
        a second alignment hole in the cartridge cover, so that the cartridge is closed for releasing a probe tip when the alignment holes are aligned with one another and with one of the longitudinal openings in the cartridge.

21. The magazine of claim 20, further comprising a means for rotating the magazine.

22. A kit for gripping and manipulating nano-manipulator probe tips, the kit comprising:
    a gripper, for selectively gripping and releasing a probe tip;
    a TEM sample holder; and,
    a cassette for transferring one or more TEM sample holders.

23. The kit of claim 22, where the gripper further comprises:
    an outer tube;
    a compression cylinder inside and coaxial with the outer tube;
    at least one elastic ring adjacent to the compression cylinder;
    a vacuum seal coaxial with the compression cylinder for receiving and sealing against the probe tip; and,
    an actuator connected to the compression cylinder for compressing the elastic ring and causing it to grip the probe tip.

24. The kit of claim 22, where the TEM sample holder further comprises:
    a bar having opposed ends;
    an arm attached to each opposed end of the bar;
    one or more slots for receiving a probe tip; and,
    each slot having an inner part and an outer part, where the inner part is smaller than the outer part.

25. The kit of claim 23, where the cassette further comprises:
    a platform;
    at least one bar extending upwardly from the platform; the bar having a groove; and,
    the groove accepting and holding a TEM sample holder.

26. The cassette of claim 25 further comprising:
    a die; the die being received by the groove;
    the die receiving and holding a TEM sample holder.

27. The kit of claim 22 where the cassette further comprises:
    a platform;
    at least one bar extending upwardly from the platform; the bar having a slot for receiving a probe tip; and,
    the slot having an inner part and an outer part, where the inner part is smaller than the outer part.

28. The cassette of claim 24, where the slots have a flexible tab at the entrance to the outer part, for retaining the probe tip.

29. The TEM sample holder of claim 24 where the border between the inner part and the outer part of the slot has a constriction.

30. The TEM sample holder of claim 24 where the border between the inner part and the outer part of the slot has a connection strip across it.

31. The TEM sample holder of claim 24 where the slot has an area of UV-curable epoxy.

32. A method for delivering a nano-manipulator probe tip into and out of a FIB, the method comprising the steps of:
    providing a gripper kit; the gripper kit comprising:
        one or more probe tips;
        a gripper;
        a TEM sample holder; and,
        a cassette for transferring one or more TEM sample holders;
    inserting one or more probe tips into the cassette;
    passing the cassette and probe tips into the FIB;
    gripping the probe tip with the gripper and removing it from the cassette;
    attaching a lift-out sample to the probe tip;
    transferring the probe tip with the attached sample to the cassette; and,
    removing the cassette and the attached sample from the FIB.

33. The method of claim 32, where the probe tip with a lift out sample is first transferred to a TEM sample holder and the TEM sample holder is then transferred to the cassette.

34. The method of claim 32, further comprising processing of the lift-out sample inside the FIB before removing it from the FIB.

35. A method for delivering a nano-manipulator probe tip into and out of a FIB, the method comprising the steps of:
    providing a gripper kit; the gripper kit comprising:
        a probe body, the probe body further comprising:
            a plurality of sections of reduced diameter at regular intervals;
            the sections of reduced diameter having a minimum diameter so that, when cut at the point of minimum diameter, the cut forms a tip point;
        a gripper;
        a TEM sample holder; and,
        a cassette for transferring one or more TEM sample holders;
    advancing a section of the probe body;
    cutting off the section, forming a probe tip having a tip point;
    gripping the probe tip with the gripper;
    attaching a lift-out sample to the probe tip;
    transferring the probe tip with the attached sample to the cassette; and,
    removing the cassette and the attached sample from the FIB.

36. The method of claim 35, where the probe tip with a lift out sample is first transferred to a TEM sample holder and the TEM sample holder is then transferred to the cassette.

37. The method of claim 35, further comprising processing of the lift-out sample inside the FIB before removing it from the FIB.

38. A method for delivering a nano-manipulator probe tip into and out of a FIB, the method comprising the steps of:
providing one or more probe tips, where the probe tips are contained in capsules;
providing a probe shaft for delivering the capsules;
providing a magazine for holding the capsules;
providing a TEM sample holder;
providing a cassette for transferring one or more TEM sample holders;
inserting one or more capsules into the magazine;
attaching a lift-out sample to one of the probe tips;
ejecting the capsule containing the probe tip with the lift-out sample from the magazine;
transferring the probe tip with the attached lift-out sample to the cassette; and,
removing the cassette and the attached lift-out sample from the FIB.

39. The method of claim 38, where the probe tip with a lift out sample is first transferred to a TEM sample holder and the TEM sample holder is then transferred to the cassette.

40. The method of claim 38, further comprising processing of the lift-out sample inside the FIB before removing it from the FIB.

* * * * *